United States Patent [19]

Chiang

[11] 4,128,843

[45] Dec. 5, 1978

[54] GaP DIRECTED FIELD UV PHOTODIODE

[75] Inventor: Alice M. Chiang, Weston, Mass.

[73] Assignee: Honeywell Inc., Minneapolis, Minn.

[21] Appl. No.: 842,443

[22] Filed: Oct. 14, 1977

[51] Int. Cl.² .................. H01L 27/14; H01L 29/90
[52] U.S. Cl. ............................ 357/30; 357/13;
357/89; 357/90; 357/91; 250/211 J
[58] Field of Search .................. 357/30, 13, 90, 89,
357/91; 250/211 J

[56] References Cited

U.S. PATENT DOCUMENTS

| | | | |
|---|---|---|---|
| 3,418,473 | 12/1968 | Blue | 250/83.3 |
| 3,563,817 | 2/1971 | Chiang et al. | 148/187 |
| 3,601,668 | 8/1971 | Slaten | 317/234 R |
| 3,889,284 | 6/1975 | Schiel | 357/30 |
| 3,959,646 | 5/1976 | de Cremoux | 250/211 J |
| 3,976,872 | 8/1976 | Peterson | 250/211 R |
| 4,044,372 | 8/1977 | Weinstein | 357/30 |
| 4,079,405 | 3/1978 | Ohuci et al. | 357/30 |

*Primary Examiner*—Martin H. Edlow
*Attorney, Agent, or Firm*—Theodore F. Neils; David R. Fairbairn

[57] ABSTRACT

A GaP photodiode having a shallow PN junction and an internal directed surface electric field exhibits high quantum efficiency in detecting ultraviolet wavelengths.

8 Claims, 15 Drawing Figures

GaP DIRECTED FIELD UV PHOTODIODE

ORIGIN OF THE INVENTION

The present invention was made in the course of a contract with the Department of the Air Force.

REFERENCE TO CO-PENDING APPLICATION

Reference is made to the co-pending application by A. Chiang, B. Denley, and J. Gelpey entitled "Method of Making a GaP UV Photodiode", which was filed on even date and is assigned to the same assignee as the present application. The co-pending application describes a preferred method of fabricating the GaP directed field UV photodiode of the present invention.

BACKGROUND OF THE INVENTION

The present invention relates to ultraviolet photodetectors. In particular, the present invention is a GaP ultraviolet sensitive photodiode.

The first consideration in the development of a solid state photodetector is matching the band gap of the detector material to the wavelength region of interest. In the case of solid state ultraviolet detectors, this has presented a serious difficulty since a wide band gap material is required. In general, the wide band gap semiconductor materials have received very little attention and are at a very early stage of development. This has, of course, hindered the development of ultraviolet sensitive solid state sensors.

Of the well-developed semiconductor materials, gallium phosphide (GaP) has the widest band gap (an indirect band gap of 2.24 eV and a direct band gap of 2.8 eV). GaP has found wide use as a material for light emitting diodes, which accounts for its relatively well-developed materials technology in comparison to other wide band gap semiconductor materials.

Because the 2.24 eV indirect band gap of GaP corresponds to a wavelength of 0.55 microns, it has been recognized that visible wavelength photodetectors could be made from GaP. Compared to CdS and other visible wavelength detector materials, however, much less work has been done in investigating the detector properties of GaP. Among the references which describe photoconductive properties of GaP in the visible spectrum are G. W. Allen and R. J. Cherry, J. Phys Chem. Solids, 23, 503 (1962); H. G. Grimmeiss and H. Scholz, Philips Res. Reports, 20, 107 (1965); P. Goldstein and S. S. Pearlman, Phys. Rev., 148, 715 (1966); D. L. Bowman, J. Appl. Phys., 38, 568 (1967); D. F. Nelson et al, Phys. Rev., 135, A1399 (1964); and U.S. Pat. Nos. 3,261,080; 3,412,252; and 3,915,754.

Petersen and Schulze, in U.S. Pat. No. 3,976,872, first reported that under some conditions a usable photoresponse to ultraviolet wavelengths can also be obtained from GaP. The specific device with which Petersen and Schulze made this initial discovery was a photoconductive GaP detector having an as-grown surface.

Subsequently, a GaP Schottky barrier device which exhibited ultraviolet photoresponse was reported in a Russian technical journal: Fiz. Tekh. Poluporev., 8, 410–413 (1974). A Schottky barrier device is a metal-to-semiconductor rectifying contact which forms a potential barrier at the interface between the metal and the semiconductor and creates an internal directed surface field within the semiconductor.

Except for the Petersen and Schulze patent and the Russian technical journal article, there have been no reports of usable ultraviolet photoresponse in GaP. In particular, prior to the present invention, there has been no report of a PN junction GaP photodiode exhibiting usable photoresponse to ultraviolet radiation. A PN junction GaP photodiode exhibiting ultraviolet photoresponse would have several advantages over the specific devices described by Petersen and Schulze, and the Russian technical journal article. First, a PN junction device may utilize developed PN junction formation technology. Second, a PN junction device may have less stringent surface preparation requirements. Third, a PN junction device has a potentially higher quantum efficiency than a Schottky barrier device because of absorption in the Schottky barrier metal contact and the potential valley just below the metal-semiconductor interface. Fourth, a PN junction device may be capable of avalanche photodiode operation. Despite these potential advantages, no PN junction GaP photodiode exhibiting ultraviolet photoresponse has been developed.

In recent years, numerous techniques have been developed and investigated for improving the response of visible wavelength solar cells. One technique which has been investigated is the use of impurity gradients in PN junctions to create internal electric field gradients. These internal electric field gradients have improved the quantum efficiency of solar cells by sweeping photogenerated minority carriers away from the surface toward the PN junction. Description of internal electric field gradients in PN junction solar cells may be found in "Photo Effect on Diffused PN Junctions with Internal Field Gradients", I.R.E. Trans. on Electron Devices, ED-7, 242 (1960); B. Ellis and T. S. Moss, "Calculated Efficiencies of Practical GaAs and Si Solar Cells Including the Effect of Built-In Electric Fields", Solid State Electronics, 13, 1 (1970); K. V. Vaidyanathan and G. H. Walker, "The Effect of Be$^+$ Ion Implanted Exponential and Uniform Impurity Profiles on the Electrical Characteristics of GaAs Cells"; and U.S. Pat. No. 4,001,864 by J. F. Gibbons. No ultraviolet response was reported for any of the devices described in these references. in addition, there was no discussion in these references of the use of GaP or the effect which a PN junction with an internal electric field gradient may have on the photoresponse of GaP.

SUMMARY OF THE INVENTION

The present invention is an ultraviolet sensitive GaP photodiode which utilizes a shallow PN junction. The photodiode includes a GaP body which has an ultraviolet radiation receiving surface and first and second regions of first and second conductivity type, respectively, which form the PN junction. The second region of second conductivity type is proximate the ultraviolet radiation receiving surface and has a graded impurity distribution which creates an internal directed surface electric field within the second region which repels minority carriers from the ultraviolet radiation receiving surface toward the PN junction.

DETAILED DESCRIPTION OF THE PREFERRED EMBODIMENTS

A successful ultraviolet sensitive solid state photodiode must provide substantial photoresponse to wavelengths shorter than 0.33 microns. Of the "well-developed" semiconductor materials, GaP has the widest band gap, and, therefore, provides the best match to the near-UV region of interest (i.e. wavelengths between about 0.1 and 0.33 microns).

When the wavelength of incident radiation is shorter than 0.44 microns, the absorption coefficient of GaP is greater than $10^4$ cm$^{-1}$. In other words, the absorption of short wavelength radiation occurs within about one micron of the front surface of GaP.

This very efficient absorption of UV energy establishes a severe requirement on the device surface properties. GaP typically has a high surface recombination velocity, so that many of the photogenerated carriers recombine before they can be collected. Petersen and Schulze discovered that GaP photoconductive detectors fabricated on as-grown surfaces of GaP exhibited substantial UV photoresponse. The reason for this UV photoresponse was that the as-grown surfaces apparently had less surface recombination centers than surfaces which had been lapped and etched.

The present invention is a GaP photodiode which eliminates the surface recombination problem and thereby permits substantial UV photoresponse to GaP by reducing the critically of surface conditions. Rather than developing super-clean surfaces on GaP, the present invention uses an internal electric field to repel photogenerated minority carriers away from the surface and toward a PN junction, where they are collected and contribute to the photosignal.

Figure 1:
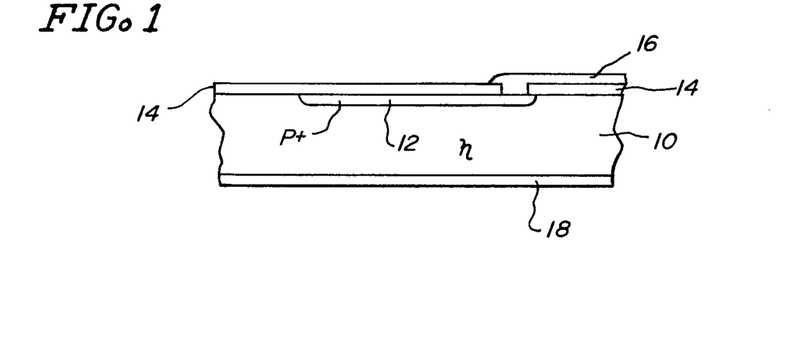
FIG. 1 shows an embodiment of the GaP ultraviolet sensitive photodiode of the present invention.

FIG. 1 shows a preferred embodiment of the present invention. The photodiode includes an N type body of GaP 10 which has a shallow (less than 0.5 microns deep) P$^+$ region 12 at the front surface of the detector. The front surface of the detector is covered with an anti-reflection coating 14, and contacts 16 and 18 form ohmic contact to the P$^+$ and N regions 12 and 10, respectively.

In the present invention, N region 10 preferably has a donor carrier concentration which is less than about $10^{17}$ carriers/cm$^3$. P$^+$ region 12 has a graded acceptor impurity concentration which preferably is greater than about $10^{18}$ carriers/cm$^3$ at the front surface which decreases monotonically from the front surface of the detector to the PN junction. The result of this graded acceptor concentration is an internal directed surface electric field which points from the junction to the surface. This electric field repels minority carriers (electrons) from the surface and accelerates them toward the junction.

Figure 2A:
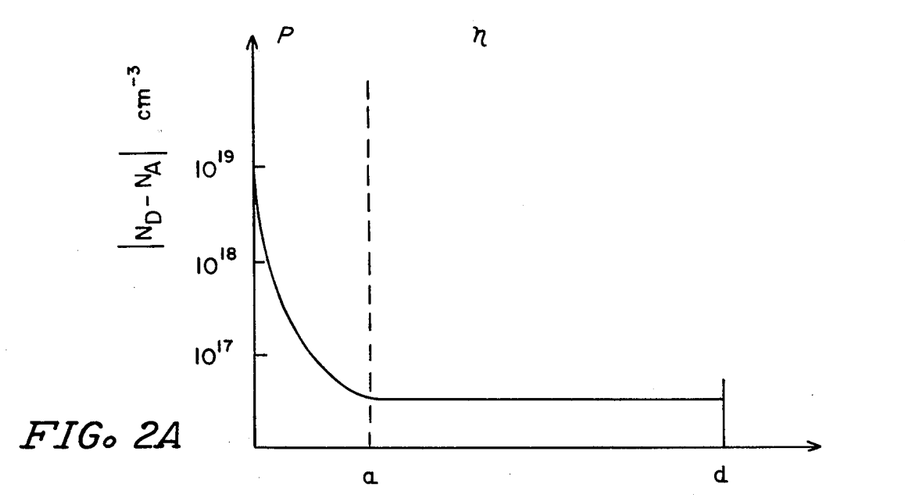
FIGS. 2A and 2B illustrate the carrier concentration and electric field with a P$^+$N GaP photodiode having an internal directed surface electric field.
Figure 2B:
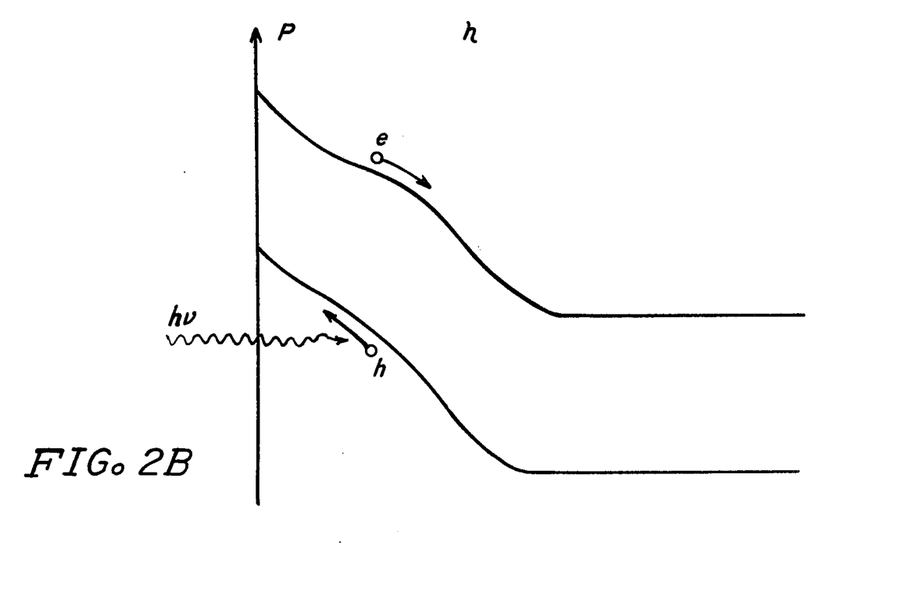

FIG. 2A illustrates the gradient in acceptor concentration utilized in the P$^+$N GaP photodiode shown in FIG. 1. FIG. 2B illustrates the resulting energy band diagram of the photodiode with the doping profile shown in FIG. 2A. This structure in the GaP photodiode of the present invention alleviates the surface recombination problem of GaP and results in a GaP photodiode capable of having a very high quantum efficiency at ultraviolet wavelengths.

In the GaP P$^+$N photodiode illustrated by FIGS. 1, 2A, and 2B, absorption of radiation in the photodiode produces electron-hole pairs. Pairs produced in the depletion region (designated by the depletion width W in FIG. 2B) or within a diffusion length of it will be separated by the electric field. The result is a current flow in the external circuit connected to the photodiode. As shown in FIG. 2A, the acceptor concentration in the P type region decreases monotonically from the surface to the junction. The directed surface of drift field E due to the impurity gradient points from the junction to the surface. This electric field repels the minority carriers (electrons) from the surface and accelerates them toward the junction. Under steady-state conditions, the total current density through the reverse-biased layer is given by $$J_{total} = J_{dr} + J_{diff}$$

where $J_{dr}$ is the drift current due to carriers generated inside the depletion region and $J_{diff}$ is the diffusion current density due to carriers generated outside the depletion layer (in the surface region and in the bulk) which diffuse into the reverse-biased junction.

Let us now derive the diffusion current from the surface region (P$^+$) under the assumption that there exists a constant drift field, E, due to the exponentially distributed impurity profile. The motion of the photogenerated minority carriers (electrons) in the layer is governed by $$\frac{J_n}{q} = \mu_e E n + D_e \frac{d}{dx} n \quad (1)$$

$$-\frac{d}{dx}\left(\frac{J_n}{q}\right) = K \Phi e^{-Kx} - \frac{n - n_o}{\tau_e} \quad (2)$$

where $\mu_e$, $\tau_e$, $D_e$ are electron mobility, lifetime and diffusivity, respectively, $\Phi$ is the monochromatic incident flux (photons/cm$^2$-s), K is the absorption coefficient at the incident wavelength, $n_o$ is the carrier density at thermal equilibrium. The above minority diffusion equation can be solved analytically with the assumption that $D_e$, $\mu_e$, $\tau_e$ are constant throughout the surface layer and the boundary conditions:

(a) at the surface, i x = 0

$$J_n/q = Sn \quad (3)$$

where S is the surface recombination velocity (b) at the junction interface, $x = a$ $$n = 0.$$

The diffused current density into the depletion region can be expressed as $$\frac{J_{diff\,n}}{q} = Q(-\alpha + K)e^{-Ka} + \quad (4)$$

$$Qfe^{-Ka}\frac{\left(\frac{S}{D_e} - \alpha\right)\cosh fa + f\sinh fa}{\left(\frac{S}{D_e} - \alpha\right)\sinh fa + f\cosh fa} -$$

$$\frac{Qfe^{-\alpha a}\left(\frac{S}{D_e} - 2\alpha + K\right)}{\left(\frac{S}{D_e} - \alpha\right)\sinh fa + f\cosh fa}$$

where we assumed that the thermally generated minority carriers are negligible. In equation (4), $$\alpha \equiv \frac{qE}{2kT}, \quad f^2 \equiv \alpha^2 + L_e^{-2} \quad (5)$$

$$Q \equiv \frac{-K\Phi}{K^2 - 2\alpha K - L_e^{-2}}$$

The quantum efficiency due to the diffusion current is defined as $$\eta_{diff} = (J_{diff}/q\Phi) \quad (6)$$

Figure 3:
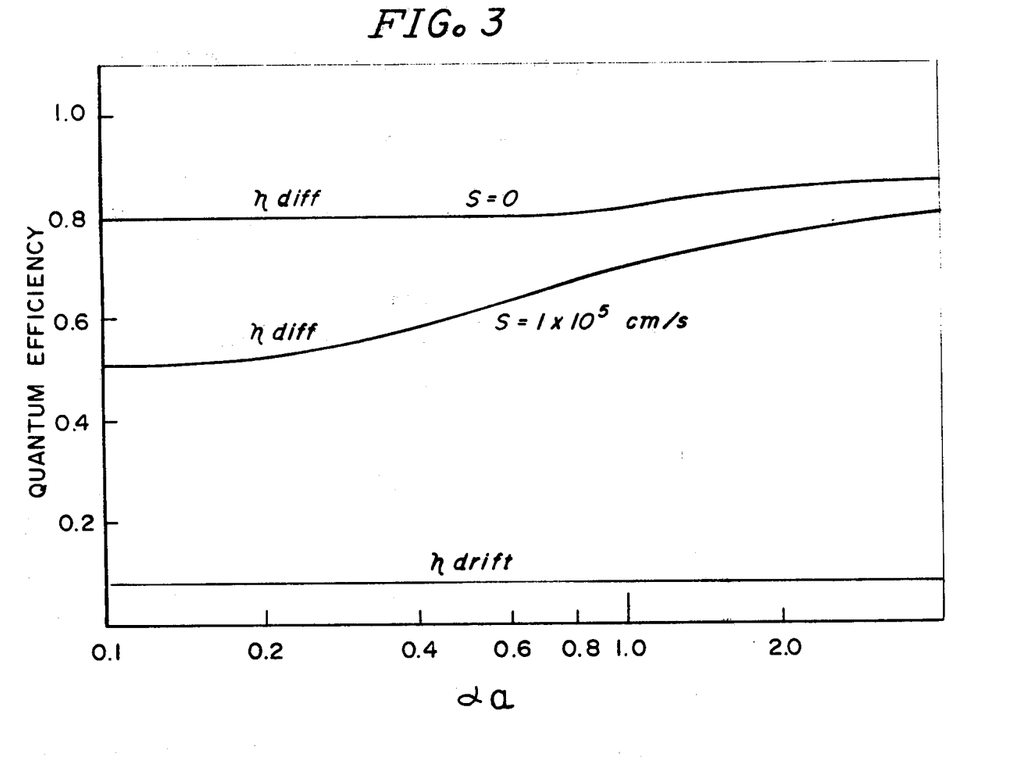
FIG. 3 shows two components of quantum efficiency $\eta$diff and $\eta$drift as a function of the directed field parameter α for two different surface recombination velocities S.

In FIG. 3, the $\eta_{diff}$ is plotted as a function of the dimensionless field dependent parameter $a_a$, with the surface recombination velocity S as a parameter. The effect of the built-in field, especially for larger values of S, is striking. Even for a high surface recombination velocity at $S = 10^5$ cm/s, with a modest built-in surface field, $E = 5 \times 10^3$ V/cm $$(\alpha = (qE/2kT) = 1 \times 10^5 \text{ cm}^{-1}, a_a = 4),$$

a diffusion quantum efficiency greater than 80% is still obtainable.

The drift current in the depletion region is given by $$J_{dr} = \int_a^{a+W} G(x)\,dx \quad (7)$$

where W is the depletion width and G (x) is the electron-hole generation rate $$G(x) = q\phi e^{-Kx} \quad (8)$$

Substitution of Eq. (8) into Eq. (7) and solution of Eq. (7) yields $$J_{dr} = q\Phi e^{-aK}(1 - e^{-WK}). \quad (9)$$

The drift current efficiency is defined by $$\eta_{dr} = J_{dr}/q\Phi = e^{-aK}(1 - e^{-WK}). \quad (10)$$

The drift efficiency is also plotted in FIG. 3 for a depletion width $W = 0.1$ μm.

The above analysis demonstrates that a shallow directed surface field PN junction in GaP does indeed alleviate the surface recombination problem. In fact, for the severe case of the example ($S = 1 \times 10^5$ cm/s), the total quantum efficiency $\eta_{diff} + \eta_{drift} = 0.88$. This is a very high quantum efficiency, and as will be demonstrated later in this specification, is higher than the maximum possible quantum efficiency for a GaP Schottky barrier UV photodiode.

Figure 4:
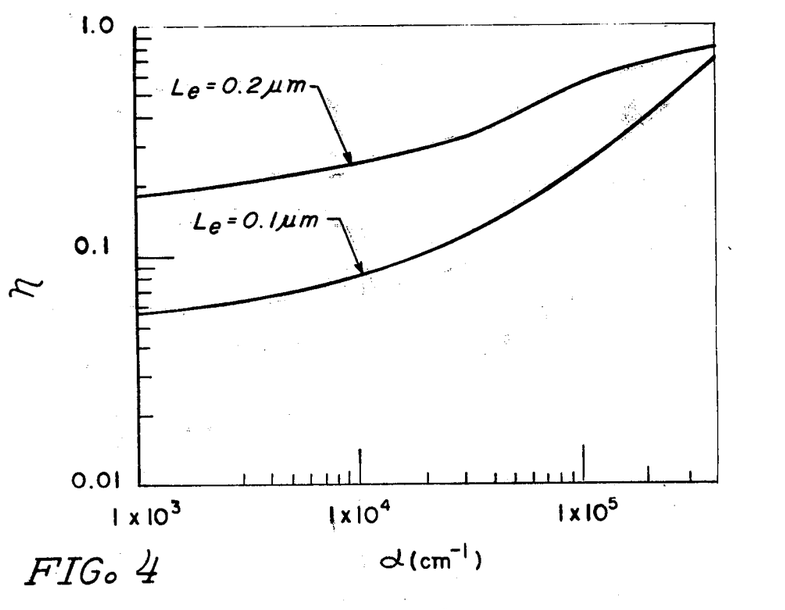
FIG. 4 shows calculated quantum efficiency for radiation having a wavelength of 0.2 microns as a function of αa for two different minority carrier diffusion lengths $L_e$.

FIG. 4 shows a calculated quantum efficiency of a GaP photodiode for UV radiation having a wavelength of 0.2 microns. The theoretical calculations used to arrive at the curve shown in FIG. 4 are illustrated in Table 1. In this theoretical calculation, quantum efficiency was determined as a function of minority carrier diffusion length $L_e$, surface recombination velocity S, built-in drift field E, and junction depth A. The calculated quantum efficiency at 0.2 microns is plotted in FIG. 4 as a function of normalized built-in field $\alpha$, where $\alpha \equiv qE/2kT$. Two different minority carrier diffusion lengths $L_e = 0.1$ microns and $L_e = 0.2$ microns were used. From FIG. 4 it can be seen that when there is no or only a weak built-in electric field in the P+ region, quantum efficiency of the GaP P+N photodiode at 0.2 microns is strongly dependent upon the minority carrier diffusion length. When the built-in field is increased, the dependence of quantum efficiency on minority carrier diffusion length (and therefore material uniformity) is decreased. For example,

| when $\alpha = 2 \times 10^3$ cm$^{-1}$ | or | $E = 100$ V/cm, |
|---|---|---|
| $\eta = 6\%$ | for | $L_e = 0.1$μm |
| 20% | for | $L_e = 0.2$μm; |
| when $\alpha = 3 \times 10^5$ cm$^{-1}$ | or | $1.5 \times 10^4$ V/cm, |
| $\eta = 62\%$ | for | $L_e = 0.1$μm |
| 74% | for | $L_e = 0.2$μm |

The strength of the built-in field in the UV photodiode of the present invention is greater than about $10^3$ V/cm, and preferably greater than about $10^4$ V/cm. These field strengths permit high quantum efficiencies and minimize the dependence on material uniformity.

TABLE 1

The diffused current density into the depletion region can be expressed as $$\frac{J_{diff\,n}}{q} = Q(-\alpha + K)e^{-Ka} +$$

$$Qfe^{-Ka}\frac{\left(\frac{S}{D_e} - \alpha\right)\cosh fa + f\sinh fa}{\left(\frac{S}{D_e} - \alpha\right)\sinh fa + f\cosh fa} -$$

$$\frac{Qfe^{-\alpha a}\left(\frac{S}{D_e} - 2\alpha + K\right)}{\left(\frac{S}{D_e} - \alpha\right)\sinh fa + f\cosh fa}$$

where $$\alpha \equiv \frac{qE}{2kT}, \quad f^2 \equiv \alpha^2 + L_e^{-2}$$

$$Q \equiv \frac{-K\Phi}{K^2 - 2K - L_e^{-2}}$$

The quantum efficiency due to the diffusion current is de-

TABLE 1-continued fined as $$\eta_{diff} = \frac{J_{diff}}{q\Phi}.$$

FIGS. 5A–5D illustrate a preferred method of fabricating the GaP ultraviolet sensitive photodiodes in the present invention. This method is also described and is claimed in the previously mentioned co-pending patent application by A. Chiang, B. Denley, and J. Gelpey.

Figure 5A:
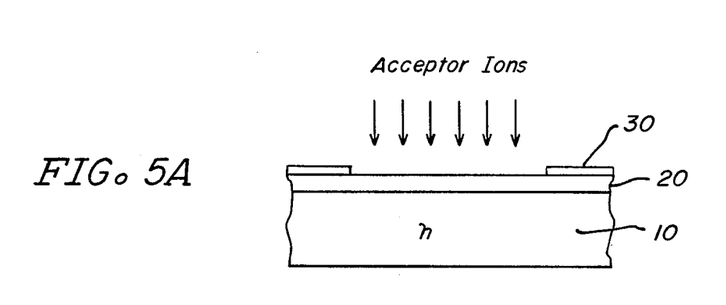
FIGS. 5A-5D illustrate a preferred method of fabricating the GaP ultraviolet sensitive photodiode of the present invention.

In FIG. 5A, an N type body 10 of GaP has a layer 20 of an insulator such as SiO, $SiO_2$, or $Si_3N_4$, deposited on its front surface. A metal mask 30 is formed on insulator layer 20 to define a region of body 10 into which acceptor ions will be implanted.

In a preferred embodiment of the present invention, the desired impurity profile is obtained by two or more successive acceptor ion implantations using different doses and different implant energies. One implant typically has a higher dose and lower implant energy than the other implantation. The result is a combined impurity profile which provides an essentially exponential acceptor profile within the P$^+$ region.

Figure 5B:
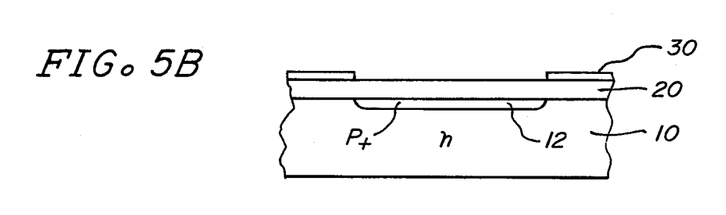

After implantation, an anneal is performed to reduce lattice damage and to activate the implanted ions. FIG. 5B shows P$^+$ region 12 after the anneal has been completed. P$^+$ region 12 is very shallow, with a depth which is less than about 0.5 microns.

Figure 5C:
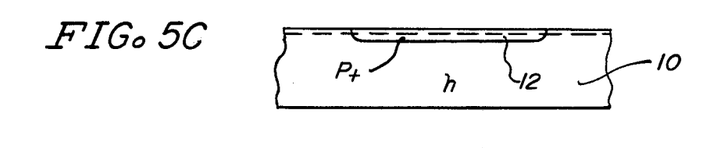

After the anneal has been completed, insulator layer 20 is removed from the surface of GaP body 10. FIG. 5C shows the photodiode after insulator layer 20 has been removed.

It has been discovered that UV photoresponse of the photodiode is enhanced if a very thin layer is removed from the front surface of body 10 after insulator layer 20 is removed. The dashed line in FIG. 5C illustrates the layer which will be removed. This thin layer is preferably about 100Å to 300Å thick.

Figure 5D:
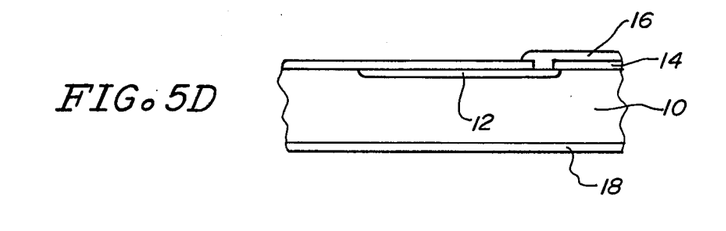

As shown in FIG. 5D, an anti-reflection coating 14 is then deposited on the front surface of the photodiode. Contacts 16 and 18 are formed to provide ohmic contact to P type region 12 and N type body 10, respectively. In one preferred embodiment, contact 16 is a gold-based zinc alloy, and contact 18 is a silver-based tellurium alloy.

Figure 6:
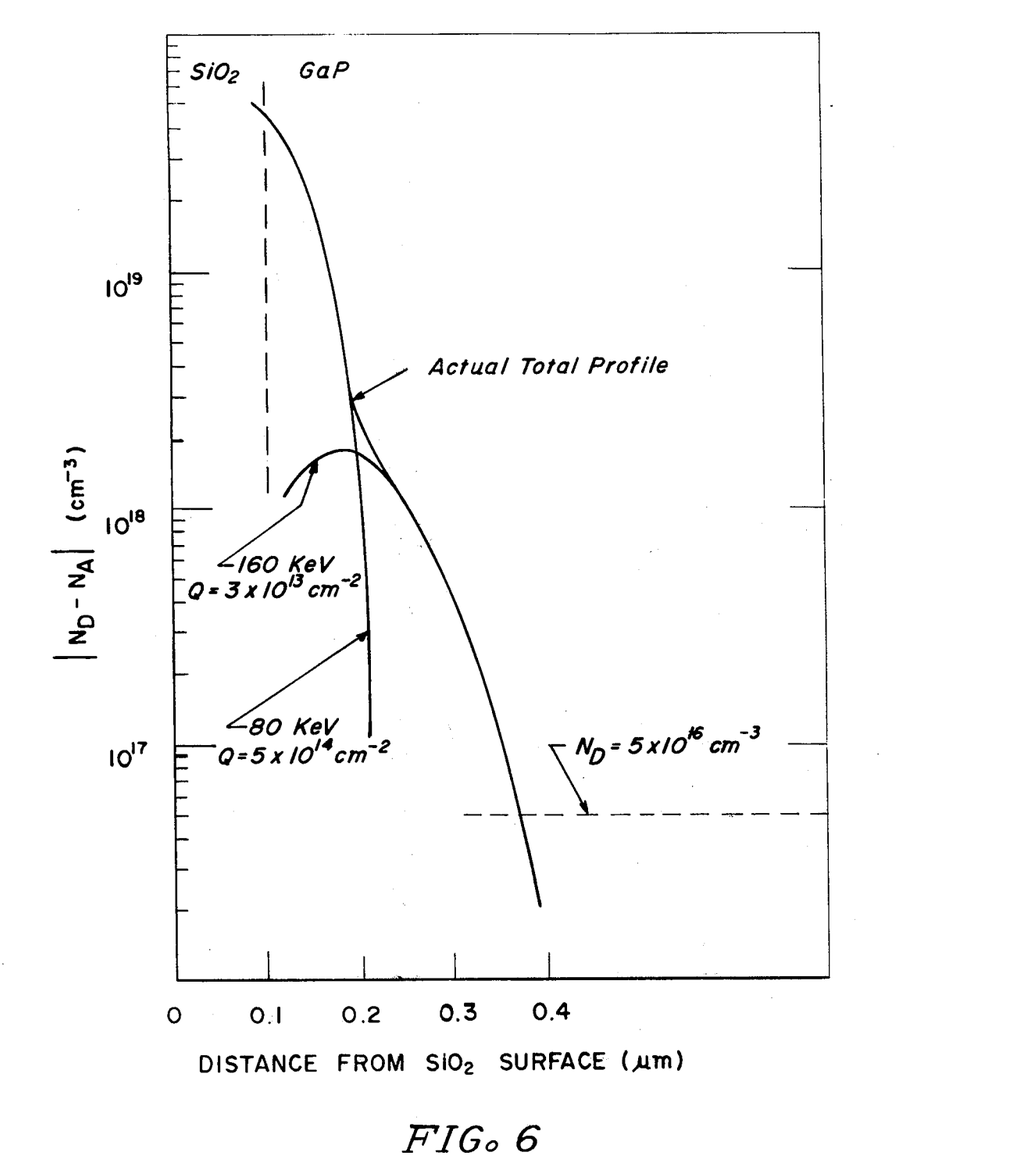
FIG. 6 shows an impurity profile of a double implanted ultraviolet sensitive GaP photodiode of the present invention.

FIG. 6 illustrates the impurity profile of one group of GaP photodiodes fabricated in accordance with the method shown in FIGS. 5A–5D. In this embodiment Czochralski grown, (111) oriented, undoped N type GaP wafers having a donor concentration of about $5 \times 10^{16}$ cm$^{-3}$ were used. These wafers were supplied by IMANCO and Metal Specialties. Implantations were performed at both 180° C. and 350° C. with subsequent anneals at 850° C. and higher. Insulator layer 20 was $SiO_2$ and had a thickness of about 1,000Å. Metal mask 30 was a chromium-gold implant mask. As shown in FIG. 6, the first implantation was at 80KeV with a dose of $5 \times 10^{14}$ cm$^{-2}$ Mg$^+$ acceptor ions. The second implantation used a higher implant energy (160KeV) and a lower dose of Mg$^+$ ions ($3 \times 10^{13}$ cm$^{-2}$). The total profile shown in FIG. 6 decreases monotonically from the surface of the GaP to the junction. The junction depth shown in FIG. 6 is slightly less than 0.3 microns.

Other ion doses and implant energies, as well as different implant and anneal temperatures, have been used to produce the P$^+$N GaP directed field UV photodiodes of the present invention. By varying implant energies, ion doses, implant temperatures, and anneal temperatures, it is possible to adjust the total profile of the impurity acceptor ions within P$^+$ region 12, as well as adjust the total depth of P$^+$ region 12.

Figure 7:
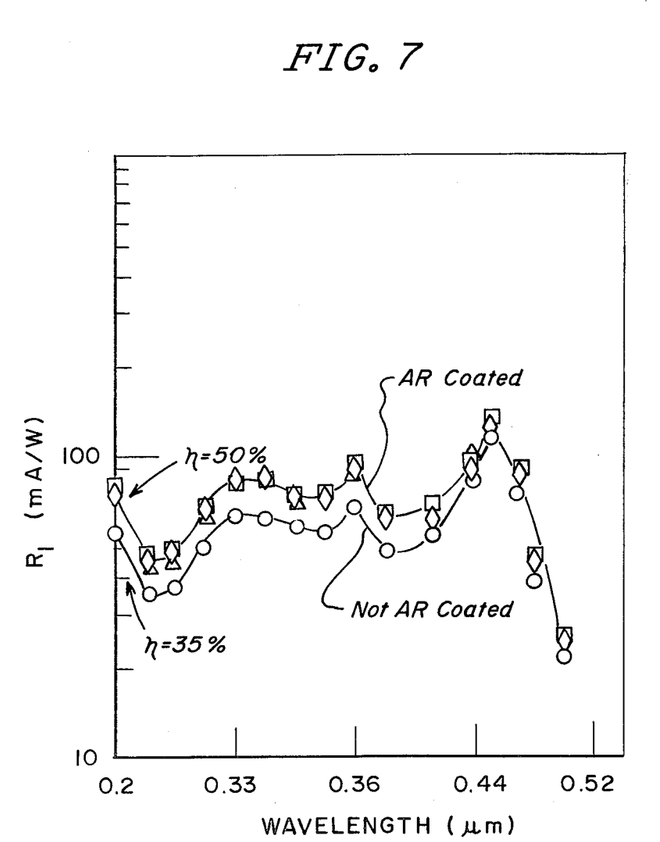
FIG. 7 shows spectral responsivity of four GaP ultraviolet detectors of the present invention.

Photoresponse tests performed on the GaP photodiodes of the present invention illustrated that the present invention is a highly advantageous ultraviolet sensitive photodiode. FIG. 7 shows spectral response of four detectors having shallow PN junctions with essentially exponential impurity profiles in the double-implanted P$^+$ region. These detectors were developed particularly for use in detecting ultraviolet radiation having a wavelength of 0.2 microns. At this wavelength the detectors which were anti-reflection coated exhibited quantum efficiencies of 50%, while the detector which was not anti-reflection coated exhibited a quantum efficiency of 35%. The directed surface field was clearly effective in permitting substantial UV photoresponse despite the high surface recombination of the GaP.

Figure 8:
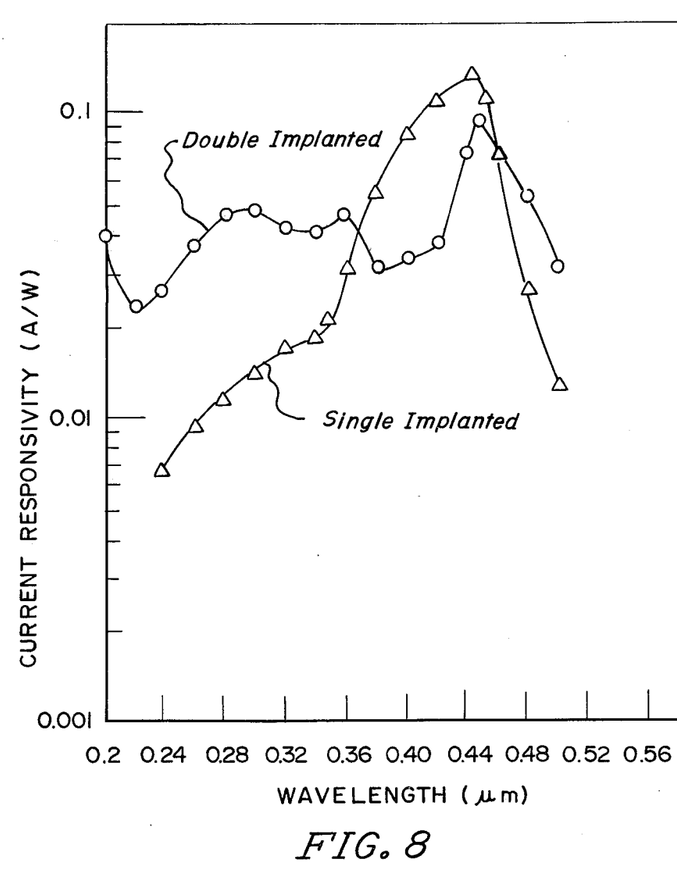
FIG. 8 shows spectral responsivities of both a single and a double implanted GaP photodiode.

FIG. 8 compares the spectral response of a double-implanted GaP P$^+$N photodiode having the directed surface field of the present invention and a single-implanted GaP photodiode having no directed surface field. The double-implanted photodiode had a detector area of $6.45 \times 10^{-4}$ cm$^2$. The two implantations were at 80KeV with a $5 \times 10^{14}$ cm$^{-2}$ dose and at 160KeV with a $3 \times 10^{13}$ cm$^{-2}$ dose. The single-implanted photodiode had a detector area of $8.56 \times 10^{-4}$ cm$^2$, and was formed using an implantation at 100KeV with a dose of $2 \times 10^{14}$ cm$^{-2}$.

As shown in FIG. 8, the directed field (double-implanted) UV photodiode of the present invention exhibited substantially higher photoresponse at ultraviolet wavelengths (i.e. wavelengths less than 0.33 microns). At 0.2 microns, the quantum efficiency of the double-implanted photodiode was 24%, while the single-implanted photodiode had a quantum efficiency of less than 10%.

Figure 9:
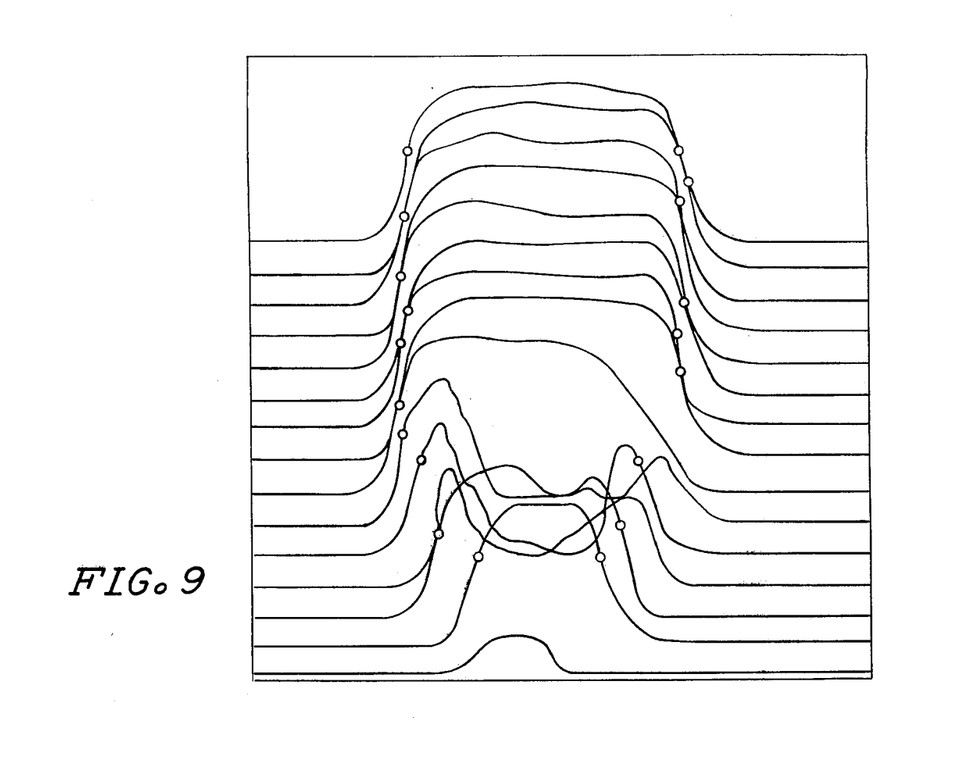
FIG. 9 illustrates the response of a GaP ultraviolet sensitive photodiode of the present invention in which the sensitive area of the photodiode was determined using spot scans.

FIG. 9 shows a spot scan of a double-implanted GaP photodiode. As shown in FIG. 9, the detector active area is very uniform.

Figure 10:
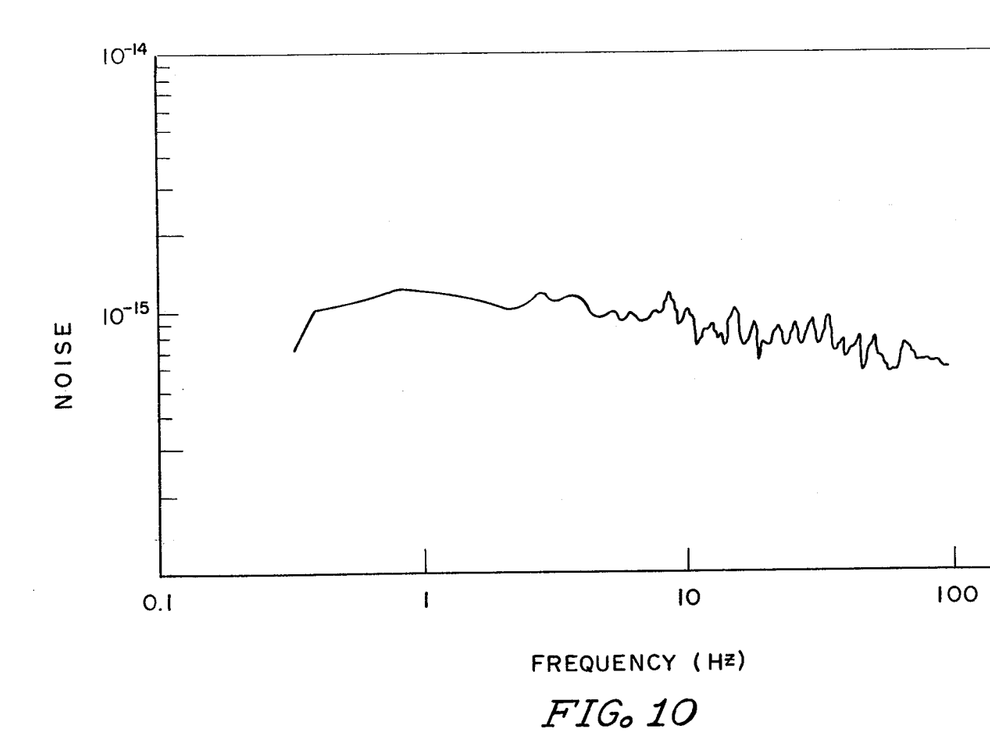
FIG. 10 shows the results of noise measurements on a GaP UV photodiode of the present invention.

FIG. 10 shows the results of noise measurements performed on one of the GaP photodiodes of the present invention. The noise is limited by the amplifier at less than $1 \times 10^{-5}$ A/Hz$^{\frac{1}{2}}$. This represents better noise characteristics than presently available silicon UV sensors.

Figure 11:
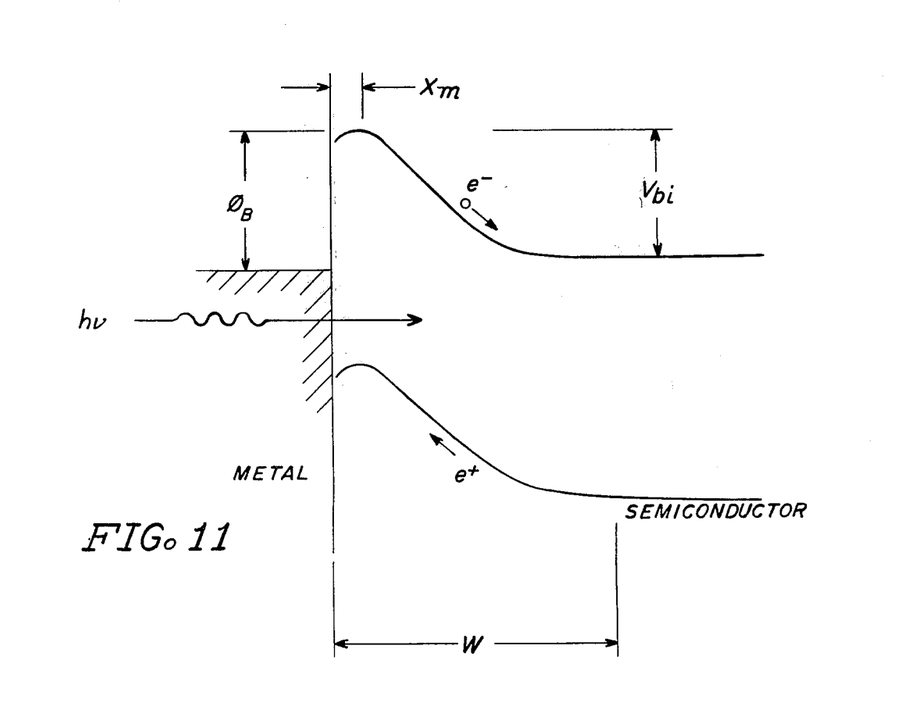
FIG. 11 illustrates the photomechanism of a Schottky barrier device.

As mentioned in the "Background of the Invention" of this patent application, it has been previously demonstrated that GaP Schottky barrier devices can exhibit response to ultraviolet wavelengths. A Schottky barrier device is a simple metal-to-semiconductor contact which has an inherent directed surface field associated with the metal-to-semiconductor junction. FIG. 11 is a schematic representation of the photomechanism of a Schottky diode.

Like the P$^+$N UV photodiode of the present invention, the directed surface field in a Schottky diode tends to sweep minority characters away from the surface. There are, however, two unique characteristics of a Schottky photodiode which reduce spectral quantum efficiency.

First, due to the induced image force, the maximum field in a Schottky barrier device is not directly at the metal-semiconductor interface, but rather a distance $X_m$ to the semi-conductor. Depending upon the distance $X_m$, a certain percentage of the radiation incident at the interface will be lost in the potential valley just below the interface (i.e. will not contribute to the photosignal).

Second, because the Schottky barrier device requires a metal film on the semiconductor to form the barrier, there also are quantum efficiency losses due to absorption in the semitransparent metal contact. It is estimated that the combined losses due to absorption in the metal contact and in the potential valley just below the surface of the metal-semiconductor interface are somewhat less than 30%. The maximum possible quantum efficiency for a Schottky barrier GaP UV photodiode to 0.2 microns radiation is estimated to be about 70%. In contrast, the calculated maximum efficiency of the P$^+$N UV photodiode of the present invention to 0.2 microns radiation is approximately 88%.

An evaluation of both Schottky barrier and P$^+$N junction GaP photodiodes indicates that the P$^+$N directed surface field UV photodiode of the present invention has several significant advantages over a Schottky barrier structure. First, the P$^+$N photodiode of the present invention has a higher potential quantum efficiency than is possible with a Schottky barrier device. Second, tests in which reverse bias voltages were applied to the junction indicated that the P$^+$N photodiode can exhibit large avalanche gain at low reverse bias while Schottky devices show almost no avalanche gain. The photodiode of the present invention, therefore, provides compatibility with an avalanche photodiode structure which provides enhanced photodiode operation.

In conclusion, the P$^+$N directed surface field GaP photodiode of the present invention exhibits substantial photoresponse to ultraviolet radiation. The device has low NEP, is capable of room temperature operation, is radiation hard, has minimized filter requirements for solar-blind operation (because GaP responds only to wavelength shorter than 0.55 microns), has small size, consumes very low power, and is capable of operation in an avalanche photodiode mode.

Although the present invention has been described with reference to preferred embodiments, workers skilled in the art will recognize that changes may be made in form and detail without departing from the spirit and scope of the invention. For example, although the present invention has been specifically described with reference to a P$^+$N structure, an N$^+$P structure may also be used. P$^+$N structure is preferred, however, due to the higher mobility of electrons in GaP.

The embodiments of the invention in which an exclusive property or right is claimed are defined as follows:

1. An ultraviolet-sensitive photodiode comprising:
   a GaP body having an ultraviolet radiation receiving surface;
   an N type region in the GaP body;
   a P type region in the GaP body proximate the ultraviolet radiation receiving surface and forming a PN junction with the N type region at a depth from the ultraviolet receiving surface of less than about 0.5 microns, the P type region having a graded impurity distribution which decreases essentially monotonically from the ultraviolet radiation receiving surface to the PN junction and creates an internal directed surface electric field of greater than about $10^3$ V/cm which repels minority carriers from the ultraviolet radiation receiving surface toward the PN junction;
   first contact means for providing electrical contact to the N type region; and
   second contact means providing electrical contact to the P type region.

2. The ultraviolet sensitive photodiode of claim 1 wherein the N type region has a carrier concentration of less than about $10^{17}$ carriers/cm.

3. The ultraviolet sensitive photodiode of claim 1 and further comprising:
   bias means connected to the contact means for applying a reverse bias to the PN junction to cause the ultraviolet sensitive photodiode to operate in an avalanche gain mode.

4. An ultraviolet sensitive photodiode comprising:
   a GaP body having a first region of first conductivity type and a second region of second conductivity type forming a PN junction in the body, the second region being proximate an ultraviolet radiation receiving surface of the GaP body and having a graded impurity distribution which creates an internal directed surface electric field of greater than about $10^3$ V/cm within the second region which repels minority carriers from the ultraviolet radiation receiving surface toward the PN junction; and
   contact means for deriving a photosignal from the GaP body.

5. The ultraviolet sensitive photodiode of claim 4 wherein the depth is less than about 0.5 microns.

6. The ultraviolet sensitive photodiode of claim 5 wherein the graded impurity distribution decreases monotonically from the ultraviolet radiation receiving surface.

7. The ultraviolet sensitive photodiode of claim 6 wherein the graded impurity distribution is an essentially exponential distribution.

8. The ultraviolet sensitive photodiode of claim 4 wherein the first conductivity type is N type and the second conductivity type is P type.

* * * * *